United States Patent
Wang

(10) Patent No.: US 10,424,242 B2
(45) Date of Patent: Sep. 24, 2019

(54) GATE DRIVE CIRCUIT HAVING SHIFT REGISTER CIRCUIT AND INVERTING CIRCUIT FOR OUTPUTTING AN OUTPUT SIGNAL

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Bo Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/772,422

(22) PCT Filed: Sep. 21, 2017

(86) PCT No.: PCT/CN2017/102681
§ 371 (c)(1),
(2) Date: Apr. 30, 2018

(87) PCT Pub. No.: WO2018/161528
PCT Pub. Date: Sep. 13, 2018

(65) Prior Publication Data
US 2019/0073948 A1    Mar. 7, 2019

(30) Foreign Application Priority Data

Mar. 6, 2017    (CN) .......................... 2017 1 0127855

(51) Int. Cl.
*G09G 3/3225*    (2016.01)
*G09G 3/36*    (2006.01)
(Continued)

(52) U.S. Cl.
CPC ......... *G09G 3/3225* (2013.01); *G09G 3/3266* (2013.01); *G09G 3/3648* (2013.01); *G11C 19/28* (2013.01); *G09G 2310/0286* (2013.01)

(58) Field of Classification Search
CPC ................................................... G09G 3/3225
(Continued)

(56) References Cited

U.S. PATENT DOCUMENTS

2002/0044625 A1*  4/2002  Kim ..................... G11C 19/184
                                                          377/54
2006/0017685 A1    1/2006  Tseng et al.
(Continued)

FOREIGN PATENT DOCUMENTS

CN        1779862 A      5/2006
CN      101393775 A      3/2009
(Continued)

OTHER PUBLICATIONS

PCT International Search Report, Application No. PCT/CN2017/102681 dated Jan. 3, 2018, 5 pages.
(Continued)

*Primary Examiner* — Long D Pham
(74) *Attorney, Agent, or Firm* — Armstrong Teasdale LLP

(57) ABSTRACT

A shift register unit and a drive method thereof, a gate drive circuit, and a display device are disclosed. The shift register unit includes a shift resister circuit which delays a phase of an input signal from an input terminal to output a first output signal from a first output terminal and an inverting circuit which generates an inverting signal having an inverted voltage with respect to the first output signal and output it from a second output terminal. The shift resister circuit includes a first input circuit configured to control a voltage of a first node, a second input circuit configured to control a voltage of a second node, a latch circuit configured to latch (Continued)

the voltage of the first node and that of the second node as being inverted, and a first output circuit configured to selectively output the second clock signal or a first voltage.

20 Claims, 4 Drawing Sheets

(51) Int. Cl.
  *G11C 19/28* (2006.01)
  *G09G 3/3266* (2016.01)
(58) Field of Classification Search
  USPC .......................................................... 345/100
  See application file for complete search history.

(56) References Cited

U.S. PATENT DOCUMENTS

2012/0050234 A1* 3/2012 Jang ..................... G09G 3/3225
                                                              345/204
2018/0025695 A1* 1/2018 Han ..................... G09G 3/3677
                                                              345/213
2018/0046048 A1* 2/2018 Zhao ..................... G11C 19/28

FOREIGN PATENT DOCUMENTS

| CN | 102654968 A | 9/2012 |
| CN | 105575328 A | 5/2016 |
| CN | 105609072 A | 5/2016 |
| CN | 106601190 A | 4/2017 |

OTHER PUBLICATIONS

PCT Written Opinion, Application No. PCT/CN2017/102681, dated Jan. 3, 2018, 12 pages.: with English translation.

* cited by examiner

GATE DRIVE CIRCUIT HAVING SHIFT REGISTER CIRCUIT AND INVERTING CIRCUIT FOR OUTPUTTING AN OUTPUT SIGNAL

CROSS-REFERENCE TO RELATED APPLICATIONS

This patent application is a National Stage Entry of PCT/CN2017/102681 filed on Sep. 21, 2017, which claims the benefit and priority of Chinese Patent Application No. 201710127855.4 filed on Mar. 6, 2017, the disclosures of which are incorporated herein by reference in their entirety as a part of the present application.

BACKGROUND

Embodiments of the present disclosure relate to the field of electronic circuits, and more particularly, to a shift register unit and a drive method thereof, a gate drive circuit, and a display device.

As a current-drive light-emitting element, an organic light-emitting diode (OLED) has become a popular display element in the existing display devices due to its light weight, slim design, quick response, high contrast, and other characteristics. In terms of drive modes, the OLED may be classified into a passive matrix OLED (PMOLED) and an active matrix OLED (AMOLED). The AMOLED has advantages of short drive time, low power consumption, wide viewing angle, etc. It is more and more widely used in devices such as televisions, tablet computers and so on.

In an AMOLED display device, generally a gate drive circuit is employed to provide a gate drive signal for each row of pixel elements to scan row by row. Typically, the gate drive circuit may include a plurality of cascaded shift register units. The output signal of each shift register unit becomes a drive signal for a gate line connected thereto.

BRIEF DESCRIPTION

Embodiments of the present disclosure provide a shift register unit which is simple in structure and stable in operation and a drive method thereof, and a gate drive circuit including the shift register unit and a display device.

A first aspect of the present disclosure provides a shift register unit. The shift register unit includes a shift resister circuit and an inverting circuit. The shift resister circuit is configured to delay a phase of an input signal from an input terminal, based on a first clock signal and a second clock signal, to output a first output signal from a first output terminal, wherein the first clock signal has an opposite phase with respect to the second clock signal. The inverting circuit is configured to generate an inverting signal having an inverted voltage with respect to the first output signal and output the inverting signal from a second output terminal. The shift resister circuit includes a first input circuit, a second input circuit, a latch circuit, and a first output circuit. The first input circuit is configured to control a voltage of a first node based on the input signal. The second input circuit is configured to control a voltage of a second node based on the first clock signal. The latch circuit is coupled between the first node and the second node and is configured to latch the voltage of the first node and the voltage of the second node, such that the voltage of the first node is inverted with respect to the voltage of the second node. The first output circuit is configured to selectively output the second clock signal or a first voltage from the first output terminal as the first output signal, based on the voltage of the first node and the voltage of the second node.

In embodiments of the present disclosure, the inverting circuit includes a third input circuit and a second output circuit. The third input circuit is configured to set a voltage of a third node as being inverted with respect to the voltage of the first output signal based on the first output signal and the first clock signal. The second output circuit is configured to selectively output the first voltage or a second voltage based on the first output signal and the voltage of the third node.

In embodiments of the present disclosure, the first input circuit includes a first transistor. A control electrode and a first electrode of the first transistor are coupled to the input terminal, and a second electrode of the first transistor is coupled to the first node.

In embodiments of the present disclosure, the second input circuit includes a second transistor. A control electrode of the second transistor is coupled to the first clock signal, a first electrode of the second transistor is coupled to the second voltage, and a second electrode of the second transistor is coupled to the second node.

In embodiments of the present disclosure, the latch circuit includes a third transistor and a fourth transistor. A control electrode of the third transistor is coupled to the first node, a first electrode of the third transistor is coupled to the first voltage, and a second electrode of the third transistor is coupled to the second node. A control electrode of the fourth transistor is coupled to the second node, a first electrode of the fourth transistor is coupled to the first voltage, and a second electrode of the fourth transistor is coupled to the first node.

In embodiments of the present disclosure, the first output circuit includes a fifth transistor, a sixth transistor, and a first capacitor. A control electrode of the fifth transistor is coupled to the first node, a first electrode of the fifth transistor is coupled to the second clock signal, a second electrode of the fifth transistor is coupled to the first output terminal, and the fifth transistor has a parasitic capacitance. A control electrode of the sixth transistor is coupled to the second node, a first electrode of the sixth transistor is coupled to the first voltage, and a second electrode of the sixth transistor is coupled to the first output terminal. A first terminal of the first capacitor is coupled to the first voltage, and a second terminal of the first capacitor is coupled to the second node.

In embodiments of the present disclosure, the third input circuit includes a seventh transistor and an eighth transistor. A control electrode of the seventh transistor is coupled to the first output terminal, a first electrode of the seventh transistor is coupled to the first voltage, and a second electrode of the seventh transistor is coupled to the third node. A control electrode of the eighth transistor is coupled to the first clock signal, a first electrode of the eighth transistor is coupled to the second voltage, and a second electrode of the eighth transistor is coupled to the third node.

In embodiments of the present disclosure, the second output circuit includes a ninth transistor, a tenth transistor, and a second capacitor. A control electrode of the ninth transistor is coupled to the first output terminal, a first electrode of the ninth transistor is coupled to the first voltage, and a second electrode of the ninth transistor is coupled to the second output terminal. A control electrode of the tenth transistor is coupled to the third node, a first electrode of the tenth transistor is coupled to the second voltage, and a second electrode of the tenth transistor is coupled to the second output terminal. A first terminal of the second capacitor is coupled to the third node, and a second terminal of the second capacitor is coupled to the second output terminal.

A second aspect of the present disclosure provides a gate drive circuit. The gate drive circuit includes a plurality of cascaded shift register units as mentioned above. An input terminal of each of the shift register units at stages other than the first stage is coupled to a first output terminal of a previous-stage shift register unit, and a first clock signal of each of the shift register units at stages other than the first stage has opposite phase with respect to a first clock signal of the previous-stage shift register unit.

A third aspect of the present disclosure provides a display device, which includes the gate drive circuit as mentioned above.

A fourth aspect of the present disclosure provides a drive method for driving the aforementioned shift register unit. In the drive method, in the first phase, the input signal and the first clock signal at the second voltage and the second clock signal at the first voltage are applied, such that the first node has the second voltage and the second node has the first voltage, and the second clock signal at the first voltage is outputted from the first output terminal, and a signal at the second voltage is outputted from the second output terminal. In the second phase, the input signal and the first clock signal at the first voltage and the second clock signal at the second voltage are applied, such that the first node keeps having the second voltage and the second node keeps having the first voltage, and the second clock signal at the second voltage is outputted from the first output terminal, and a signal at the first voltage is outputted from the second output terminal. In the third phase, the input signal and the second clock signal at the first voltage and the first clock signal at the second voltage are applied, such that the second node has the second voltage and the first node has the first voltage, and a signal at the first voltage is outputted from the first output terminal, and a signal at the second voltage is outputted from the second output terminal.

In embodiments of the present disclosure, the first input circuit includes a first transistor, the second input circuit includes a second transistor, and the latch circuit includes a third transistor and a fourth transistor. In the first phase, the input signal at the second voltage enables the first transistor, such that the first node has the second voltage, the first clock signal at the second voltage enables the second transistor, and the first node with the second voltage enables the third transistor and disables the fourth transistor, such that the second node has the first voltage. In the second phase, the input signal at the first voltage disables the first transistor, the first clock signal at the first voltage disables the second transistor, and the first output circuit keeps the first node having the second voltage and keeps the second node having the first voltage, such that the third transistor keeps on and the fourth transistor keeps off. In the third phase, the first clock signal at the second voltage enables the second transistor, such that the second node has the second voltage, the input signal at the first voltage disables the first transistor, the second node with the second voltage enables the fourth transistor and disables the third transistor, such that the first node has the first voltage.

In embodiments of the present disclosure, the first output circuit includes a fifth transistor, a sixth transistor, and a first capacitor. In the first phase, the second node with the first voltage disables the sixth transistor, and the first node with the second voltage enables the fifth transistor, such that the second clock signal at the first voltage is outputted from the first output terminal. In the second phase, the parasitic capacitance of the fifth transistor keeps the first node having the second voltage, the latch circuit keeps the second node having the first voltage, the first node with the second voltage keeps the fifth transistor on, and the second node with the first voltage keeps the sixth transistor off, such that the second clock signal at the second voltage is outputted from the first output terminal. In the third phase, the first node with the first voltage disables the fifth transistor, and the second node with the second voltage enables the sixth transistor, such that a signal at the first voltage is outputted from the first output terminal.

In embodiments of the present disclosure, the third input circuit includes a seventh transistor and an eighth transistor. In the first phase, the first output terminal with the first voltage disables the seventh transistor, and the first clock signal at the second voltage enables the eighth transistor, such that the third node has the second voltage. In the second phase, the first clock signal at the first voltage disables the eighth transistor, and the first output terminal with the second voltage enables the seventh transistor, such that the third node has the first voltage. In the third phase, the first output terminal with the first voltage disables the seventh transistor, and the first clock signal at the second voltage enables the eighth transistor, such that the third node has the second voltage.

In embodiments of the present disclosure, the second output circuit includes a ninth transistor, a tenth transistor, and a second capacitor. In the first phase, the first output terminal with the first voltage disables the ninth transistor, and the third node with the second voltage enables the tenth transistor, such that a signal at the second voltage is outputted from the second output terminal. In the second phase, the third node with the first voltage disables the tenth transistor, and the first output terminal with the second voltage enables the ninth transistor, such that a signal at the first voltage is outputted from the second output terminal. In the third phase, the first output terminal with the first voltage disables the ninth transistor, and the third node with the second voltage enables the tenth transistor, such that a signal at the second voltage is outputted from the second output terminal.

BRIEF DESCRIPTION OF THE DRAWINGS

To describe technical solutions of the embodiments of the present disclosure more clearly, the accompanying drawings of the embodiments will be briefly introduced in the following. It should be known that the accompanying drawings in the following description merely involve some embodiments of the present disclosure, but do not limit the present disclosure, in which.

DETAILED DESCRIPTION

Figure 1:
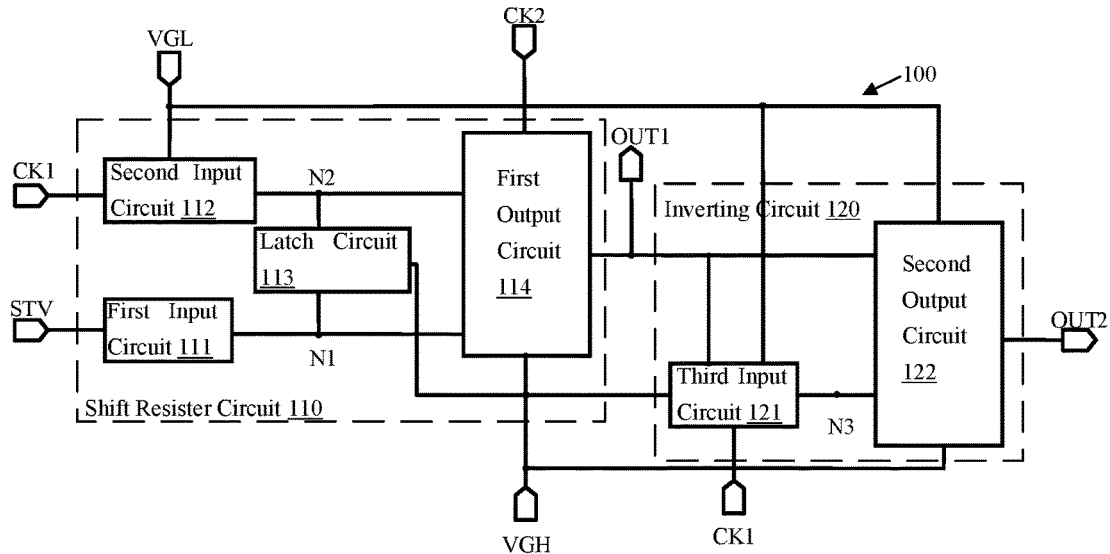
FIG. 1 is a schematic block diagram of a shift register unit according to an embodiment of the present disclosure.

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a source and a drain (an emitter and a collector) of a transistor are symmetrical, and a current from the source to the drain (from the emitter to the collector) to turn on an N-type transistor is in an opposite direction with respect to the current from the source to the drain (from the emitter and the collector) to turn on an a P-type transistor. Therefore, in the embodiments of the present disclosure, a controlled intermediate terminal of the transistor is referred to as a control electrode, a signal input terminal is referred to as a first electrode, and a signal output terminal is referred to as a second electrode. The transistors used in the embodiments of the present disclosure mainly are switching transistors. In addition, terms such as "first" and "second" are only used to distinguish one element (or a part of the element) from another element (or another part of this element).

In the present disclosure, the "first voltage" and the "second voltage" is respectively either of the high voltage and the low voltage. If the first voltage is the high voltage, the second voltage is the low voltage, whereas if the first voltage is the low voltage, the second voltage is the high voltage. The high voltage and the low voltage refer to a higher preset voltage and a lower preset voltage with respect to each other. Those skilled in the art may set the high voltage and the low voltage based on the selected device and the adopted circuit structure, the present disclosure is not limited thereto.

In the present disclosure, the "normal clock signal" and the "inverted clock signal" are a pair of clock signals that are inverting signals with respect to each other. When the normal clock signal is at the high voltage, the inverted clock signal is at the low voltage, whereas when the normal clock signal is at the low voltage, the inverted clock signal is at the high voltage. Those skilled in the art may set the normal clock signal and the inverted clock signal based on the selected device and the adopted circuit structure, the present disclosure is not limited thereto.

Embodiments of the present disclosure are described below in detail taking an example where the first voltage is the high voltage VGH (for example, 7V) while the second voltage is the low voltage VGL (for example, −7V). Those skilled in the art should understand that in an alternative embodiment of the present disclosure, the first voltage may be a low voltage VGL while the second voltage may be a high voltage VGH.

FIG. 1 illustrates a schematic block diagram of a shift register unit 100 according to an embodiment of the present disclosure. As shown in FIG. 1, the shift register unit 100 according to an embodiment of the present disclosure includes a shift resister circuit 110 and an inverting circuit 120. The shift resister circuit 110 is configured to delay a phase of an input signal STV from an input terminal, based on a first clock signal CK1 and a second clock signal CK2, to output a first output signal OUT1 from a first output terminal, wherein the first clock signal CK1 has an opposite phase with respect to the second clock signal CK2. The inverting circuit 120 is configured to generate an inverting signal OUT2 having an inverted voltage with respect to the first output signal OUT1 and output the inverting signal OUT2 from a second output terminal.

As shown in FIG. 1, the shift resister circuit 110 includes a first input circuit 111, a second input circuit 112, a latch circuit 113, and a first output circuit 114. The first input circuit 111 is configured to control a voltage of a first node N1 based on the input signal STV. The second input circuit 112 is configured to control a voltage of a second node N2 based on the first clock signal CK1. The latch circuit 113 is coupled between the first node N1 and the second node N2 and is configured to latch the voltage of the first node N1 and the voltage of the second node N2, such that the voltage of the first node N1 is inverted with respect to the voltage of the second node N2. The first output circuit 114 is configured to selectively output the second clock signal CK2 or a first voltage VGH from the first output terminal based on the voltage of the first node N1 and the voltage of the second node N2.

The inverting circuit 120 includes a third input circuit 121 and a second output circuit 122. The third input circuit 121 is configured to set a voltage of a third node N3 as being inverted with respect to the voltage of the first output signal OUT1 based on the first output signal OUT1 and the first clock signal CK1. The second output circuit 122 is configured to selectively output the first voltage VGH or a second voltage VGL based on the first output signal OUT1 and the voltage of the third node N3.

Based on the above configuration, outputs of two gate drive signals may be implemented in one shift register unit. Therefore, compared with the scheme that two gate drive signals are respectively outputted from two shift register units, the proposed circuit structure may be simplified, and thus the layout space may be reduced and the fabrication cost may be lowered. Moreover, the latch circuit may ensure the first output signal of the shift register unit to be more stable, and then ensure the second output signal to be more stable.

Figure 2:
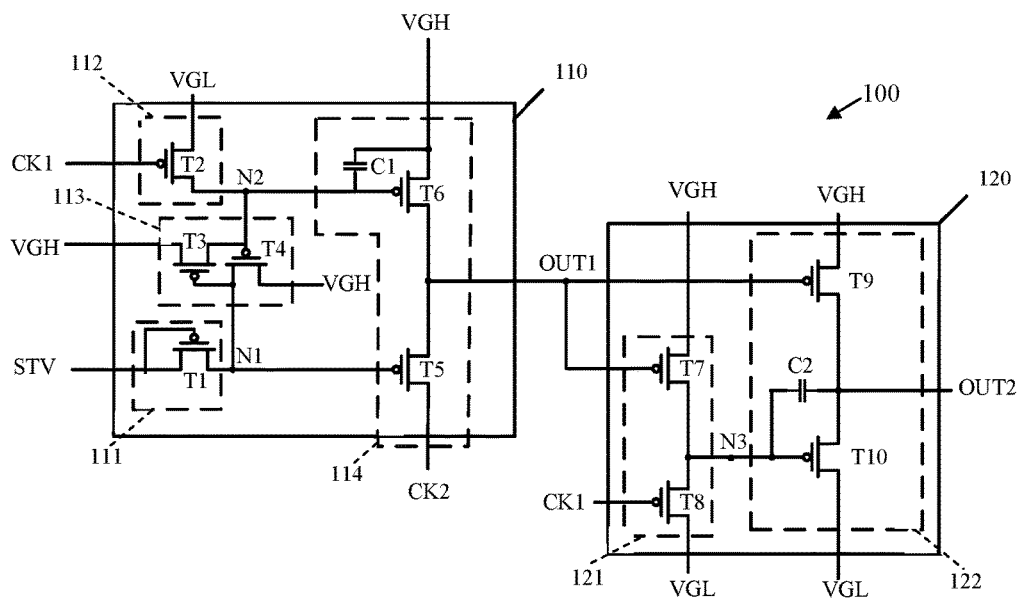
FIG. 2 is an exemplary circuit diagram for illustrating a shift register unit as shown in FIG. 1.

FIG. 2 is an exemplary circuit diagram for illustrating the shift register unit as shown in FIG. 1. As shown in FIG. 2, in this exemplary example, the first input circuit 111 includes a first transistor T1. A control electrode and a first electrode of the first transistor T1 are coupled to the input terminal STV, and a second electrode of the first transistor T1 is coupled to the first node N1.

The second input circuit 112 includes a second transistor T2. A control electrode of the second transistor T2 is coupled to the first clock signal CK1, a first electrode of the second transistor T2 is coupled to the second voltage VGL, and a second electrode of the second transistor T2 is coupled to the second node N2.

The latch circuit 113 includes a third transistor T3 and a fourth transistor T4. A control electrode of the third transistor T3 is coupled to the first node N1, a first electrode of the third transistor T3 is coupled to the first voltage VGH, and a second electrode of the third transistor T3 is coupled to the second node N2. A control electrode of the fourth transistor T4 is coupled to the second node N2, a first electrode of the fourth transistor T4 is coupled to the first voltage VGH, and a second electrode of the fourth transistor T4 is coupled to the first node N1. In this way, the control electrode and the output terminal of the third transistor T3 are respectively coupled to the output terminal and the control electrode of the fourth transistor T4. Therefore, only one of the third transistor T3 and the fourth transistor T4 are on at the same moment, such that the voltage of the first node N1 and the voltage of the second node N2 are latched and the voltage of the first node N1 is kept being inverted with respect to the voltage of the second node N2.

As one example, a width-to-length ratio of the second transistor T2 is set to be smaller than that of the third transistor T3, such that an internal resistance of the second transistor T2 is greater than that of the third transistor T3. As thus, when both the second transistor T2 and the third transistor T3 are on simultaneously, the voltage of the second node N2 is equal to that of the first electrode of the third transistor T3.

The first output circuit 114 includes a fifth transistor T5, a sixth transistor T6, and a first capacitor C1. A control electrode of the fifth transistor T5 is coupled to the first node N1, a first electrode of the fifth transistor T5 is coupled to the second clock signal CK2, and a second electrode of the fifth transistor T5 is coupled to the first output terminal OUT1. A control electrode of the sixth transistor T6 is coupled to the second node N2, a first electrode of the sixth transistor T6 is coupled to the first voltage VGH, and a second electrode of the sixth transistor T6 is coupled to the first output terminal OUT1. A first terminal of the first capacitor C1 is coupled to the first voltage VGH, and a second terminal of the first capacitor C1 is coupled to the second node N2.

The fifth transistor T5 has a parasitic capacitance. As thus, in the case that the first node N1 has the second voltage because the input signal STV has, for example, the second voltage, the fifth transistor T5 is enabled, such that the second clock signal CK2 is outputted from the first output terminal OUT1. In the case that the input signal STV has, for example, the first voltage, the first node N1 can be still kept at the second voltage because the fifth transistor T5 has the parasitic capacitance, such that the second clock signal CK2 continues to be outputted from the first output terminal OUT1.

As shown in FIG. 2, in this exemplary example, the third input circuit 121 includes a seventh transistor T7 and an eighth transistor T8. A control electrode of the seventh transistor T7 is coupled to the first output terminal OUT1, a first electrode of the seventh transistor T7 is coupled to the first voltage VGH, and a second electrode of the seventh transistor T7 is coupled to the third node N3. A control electrode of the eighth transistor T8 is coupled to the first clock signal CK1, a first electrode of the eighth transistor T8 is coupled to the second voltage VGL, and a second electrode of the eighth transistor T8 is coupled to the third node N3.

The second output circuit 122 includes a ninth transistor T9, a tenth transistor T10, and a second capacitor C2. A control electrode of the ninth transistor T9 is coupled to the first output terminal OUT1, a first electrode of the ninth transistor T9 is coupled to the first voltage VGH, and a second electrode of the ninth transistor T9 is coupled to the second output terminal OUT2. A control electrode of the tenth transistor T10 is coupled to the third node N3, a first electrode of the tenth transistor T10 is coupled to the second voltage VGL, and a second electrode of the tenth transistor T10 is coupled to the second output terminal OUT2. A first terminal of the second capacitor C2 is coupled to the third node N3, and a second terminal of the second capacitor C2 is coupled to the second output terminal OUT2.

Figure 3:
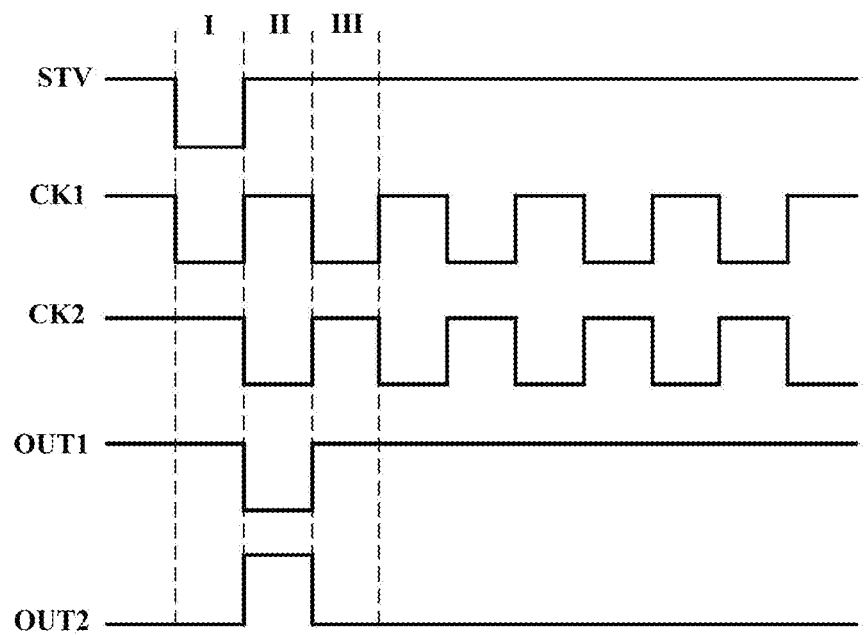
FIG. 3 is a timing diagram of each signal of the shift register unit as shown in FIG. 2.

FIG. 3 is a timing diagram of each signal of the shift register unit 100 as shown in FIG. 2. A working process of the shift register unit 100 according to embodiments of the present disclosure is described below with reference to FIG. 3 taking a P-type transistor as an example.

In the first phase I, STV=0, CK1=0, and CK2=1, wherein "0" represents a low voltage, and "1" represents a high voltage. Therefore, VGH=1, and VGL=0.

The first transistor T1 is enabled because the input signal STV is at the low voltage VGL, such that the first node N1 has the low voltage VGL. Both the third transistor T3 and the fifth transistor T5 are enabled because the first node N1 has the low voltage VGL. The second transistor T2 is enabled because the first clock signal CK1 is at the low voltage VGL. The width-to-length ratio of the second transistor T2 is smaller than that of the third transistor T3, such that the internal resistance of the second transistor T2 is greater than that of the third transistor T3. Therefore, the voltage of the second node N2 is the high voltage VGH inputted from the first electrode of the third transistor T3. The high voltage VGH of the second node N2 charges the high voltage VGH to the second terminal of the first capacitor C1 and disables the fourth transistor T4 and the sixth transistor T6. The fourth transistor T4 is disabled, such that the voltage of the first node N1 is not affected by the fourth transistor T4. The fifth transistor T5 is enabled and the sixth transistor T6 is disabled. Therefore, the second clock signal CK2 (that is, the high voltage VGH) inputted from the first electrode of the fifth transistor T5 is outputted from the first output terminal OUT1.

Both the seventh transistor T7 and the ninth transistor T9 are disabled because the voltage of the first output terminal OUT1 is the high voltage VGH. Under the control of the low voltage VGL of the first clock signal CK1, the eighth transistor T8 is enabled, such that the third node N3 has the low voltage VGL. The low voltage VGL of the third node N3 enables the tenth transistor T10, such that the low voltage VGL is outputted from the second output terminal OUT2.

In the second phase, STV=1, CK1=1 and CK2=0.

The first transistor T1 is disabled because the input signal STV is at the high voltage VGH. The second transistor T2 is disabled because the first clock signal CK1 is at the high voltage VGH. The high voltage VGH in the previous phase is maintained at the second terminal of the capacitor C1. Therefore, the second node N2 keeps the high voltage VGH. Therefore, the fourth transistor T4 is disabled, such that the voltage of the first node N1 is not affected by the fourth transistor T4. Moreover, the parasitic capacitance of the fifth transistor T5 keeps the first node N1 at the low voltage VGL. Both the third transistor T3 and the fifth transistor T5 continue to be enabled because the first node N1 has the low voltage VGL. As thus, the voltage of the second node N2 is stabilized to be the high voltage VGH inputted from the first electrode of the third transistor T3, such that the sixth transistor T6 is disabled. Since the fifth transistor T5 is enabled and the sixth transistor T6 is disabled, the second clock signal (that is, the low voltage VGL) inputted from the first electrode of the fifth transistor T5 is outputted from the first output terminal OUT1.

Both the seventh transistor T7 and the ninth transistor T9 are enabled because the voltage of the first output terminal OUT1 is the low voltage VGL. The high voltage VGH is inputted from the first electrode of the seventh transistor T7, such that the third node N3 has the high voltage VGH. The first clock signal CK1 in this phase is at the high voltage VGH. Therefore, the eighth transistor T8 is disabled, such that the voltage of the third node N3 is not affected by the eighth transistor T8. The high voltage VGH of the third node N3 disables the tenth transistor T10. Therefore, the high voltage VGH inputted from the first electrode of the ninth transistor T9 is outputted from the second output terminal OUT2.

In the third phase, STV=1, CK1=0 and CK2=1.

The first transistor T1 is disabled because the input signal STV is at the high voltage VGH. The second transistor T2 is enabled because the first clock signal CK1 is at the low voltage VGL, such that the second terminal of the capacitor C1 is discharged. Therefore, the second node N2 has the low voltage VGL. At this moment, the fourth transistor T4 is enabled, such that the voltage of the first node N1 is pulled up to the high voltage. Both the third transistor T3 and the fifth transistor T5 are disabled because the first node N1 has the high voltage VGH. Therefore, the voltage of the second node N2 is stabilized to be the low voltage VGL inputted from the first electrode of the second transistor T2 and is not affected by the third transistor T3. The low voltage VGL of the second node N2 enables the sixth transistor T6. Since the fifth transistor T5 is disabled and the sixth transistor T6 is enabled, the high voltage VGH inputted from the first electrode of the sixth transistor T6 is outputted from the first output terminal OUT1.

Both the seventh transistor T7 and the ninth transistor T9 are disabled because the voltage of the first output terminal OUT1 is the high voltage VGH. Under the control of the low voltage VGL of the first clock signal CK1, the eighth transistor T8 is enabled, such that the third node N3 has the low voltage VGL. The low voltage VGL of the third node N3 causes the second capacitor C2 to be discharged from the first terminal thereof and enables the tenth transistor T10, such that the low voltage VGL is outputted from the second output terminal OUT2.

In the subsequent phases, the STV always has the high voltage VGH. Therefore, the voltage of the first node N1 is not affected by the first transistor T1 and is kept at the high voltage VGH. As thus, the third transistor T3 is always off and the fourth transistor T4 is always on. The second terminal of the first capacitor C1 is kept at the low voltage VGL as in the third phase. Therefore, the voltage of the first output terminal OUT1 is kept at the high voltage VGH.

Both the seventh transistor T7 and the ninth transistor T9 are kept off because the voltage of the first output terminal OUT1 is kept at the high voltage VGH. The voltage of the third node N3 is not affected by the seventh transistor T7 and is kept at the low voltage VGL by the first terminal of the second capacitor C2. As thus, the low voltage VGL is kept outputting from the second output terminal OUT2.

In the above phase, the third transistor T3 and the fourth transistor T4 are always kept in an opposite state, such that the voltage of the first node N1 and the voltage of the second node N2 are latched and the voltage of the first node N1 is kept being inverted with respect to the voltage of the second node N2. Therefore, the first output signal OUT1 of the shift register unit 100 is more stable, and thus the second output signal OUT2 is more stable.

Those skilled in the art should understand that the circuits of the shift register unit 100 according to embodiments of the present disclosure may be implemented adopting N-type transistors when the first voltage is the low voltage VGL whereas the second voltage is the high voltage VGH.

Figure 4:
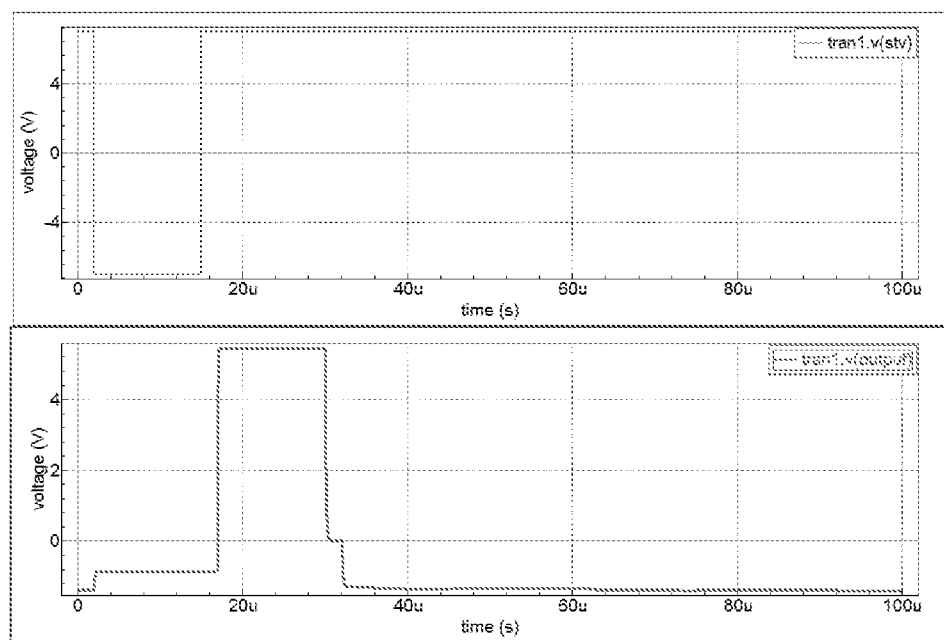
FIG. 4 is a timing diagram of a circuit simulation of the shift register unit as shown in FIG. 2.

FIG. 4 is a timing diagram of the circuit simulation of the shift register unit as shown in FIG. 2. The waveform on the upper part of FIG. 4 is the input signal STV, and the waveform on the lower part of FIG. 4 is the second output signal OUT2. As can be seen, the waveform diagram of the input signal and that of the output signal in FIG. 4 is consistent with that in FIG. 3. This indicates that the shift register unit according to this embodiment can normally work based on the expected timing sequence to achieve the expected technical effects.

Figure 5:
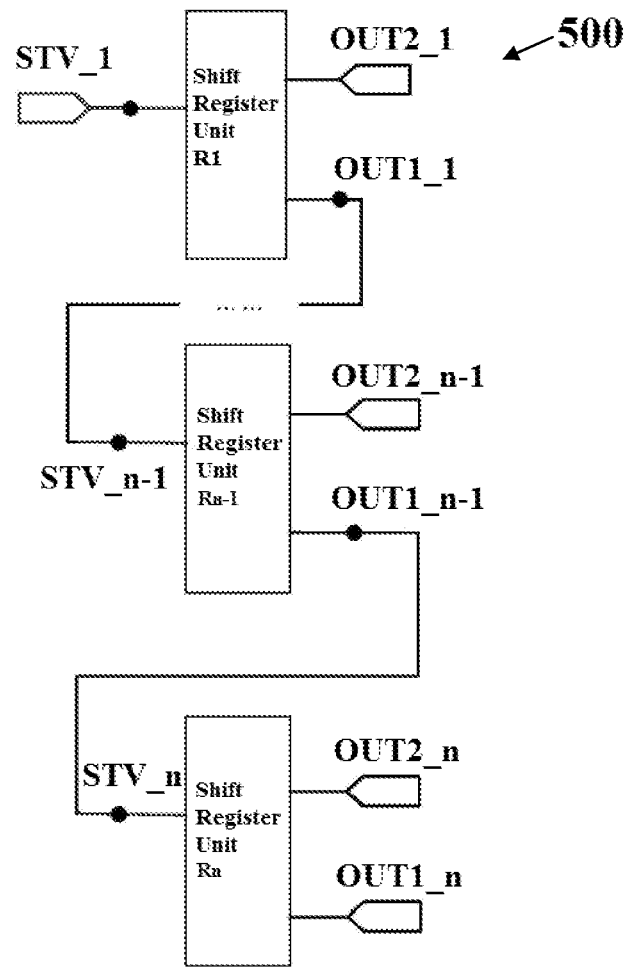
FIG. 5 is a structural block diagram of a gate drive circuit according to an embodiment of the present disclosure.

FIG. 5 is a structural block diagram of a gate drive circuit 500 according to an embodiment of the present disclosure. The gate drive circuit 500 includes a plurality of cascaded shift register units 100 as mentioned above. An input terminal STV n of each of the shift register units Rn other than the first-stage shift register R1 is connected to a first output terminal OUT1_$n$−1 of a previous-stage shift register unit Rn−1, and a first clock signal CK1_$n$ of each of the shift register units Rn at stages other than the first stage is one (i.e., has opposite phase) of the normal clock signal and the inverted clock signal and a first clock signal CK1_$n$−1 of the previous-stage shift register unit Rn−1 is the other of the normal clock signal and the inverted clock signal.

The first output signal OUT1_$n$ and the second output signal OUT2_$n$ of each of the shift register units Rn are more stable, and thus the output of the gate drive circuit can be more stable.

Figure 6:
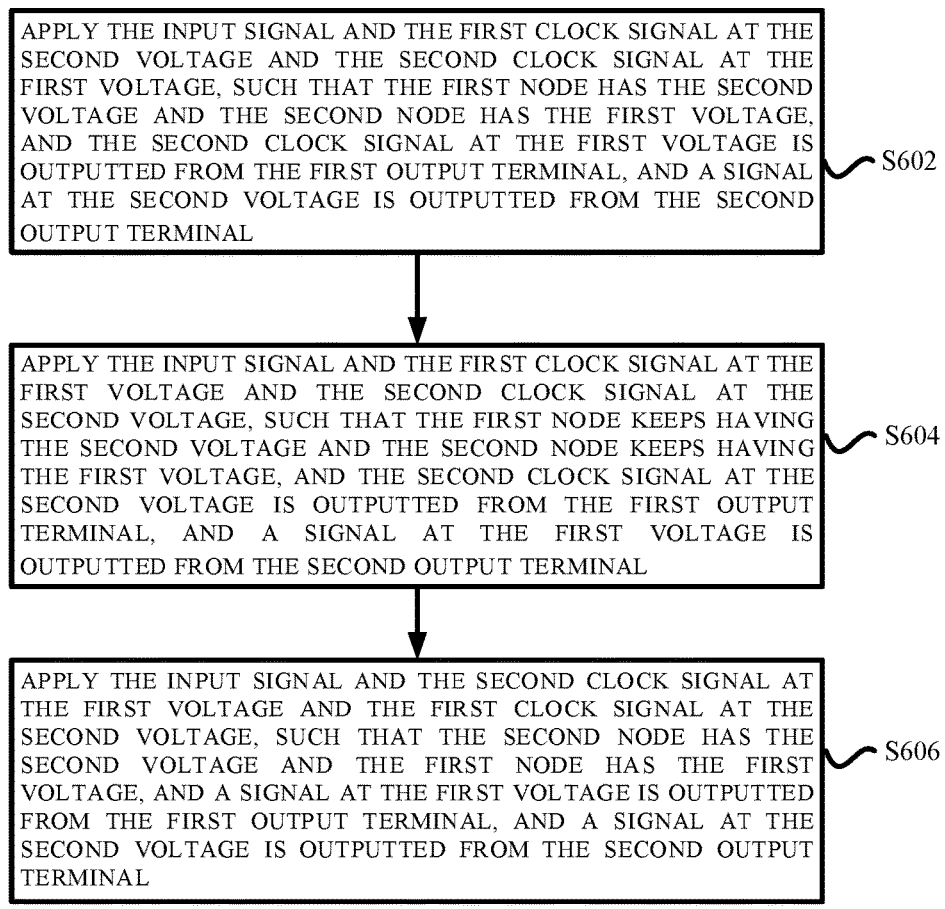
FIG. 6 is a flowchart of a drive method for driving the shift register unit according to an embodiment of the present disclosure.

FIG. 6 is a flowchart of a drive method for driving the shift register unit according to an embodiment of the present disclosure. As shown in FIG. 6, the drive method includes the following steps.

In the first phase (i.e., Step S602), the input signal STV and the first clock signal CK1 at the second voltage (such as VGL) and the second clock signal CK2 at the first voltage (such as VGH) are applied, such that the first node N1 has the second voltage (such as VGL), the second clock signal CK2 at the first voltage (such as VGH) is outputted from the first output terminal OUT1, and the third node N3 has the second voltage (such as VGL), and a signal at the second voltage (such as VGL) is outputted from the second output terminal OUT2.

In the second phase (i.e., Step S604), the input signal STV and the first clock signal CK1 at the first voltage (such as VGH) and the second clock signal CK2 at the second voltage (such as VGL) are applied, such that the first node N1 keeps having the second voltage (such as VGL), the second clock signal CK2 at the second voltage (such as VGL) is outputted from the first output terminal OUT1, and the third node N3 has the first voltage (such as VGH), and a signal at the first voltage (such as VGH) is outputted from the second output terminal OUT2.

In the third phase (i.e., Step S606), the input signal STV and the second clock signal CK2 at the first voltage (such as VGH) and the first clock signal CK1 at the second voltage (such as VGL) are applied, such that the second node N2 has the second voltage (such as VGL), a signal at the first voltage (such as VGH) is outputted from the first output terminal OUT1, and the third node N3 has the second voltage (such as VGL), and a signal at the second voltage (such as VGL) is outputted from the second output terminal OUT2.

Figure 7:
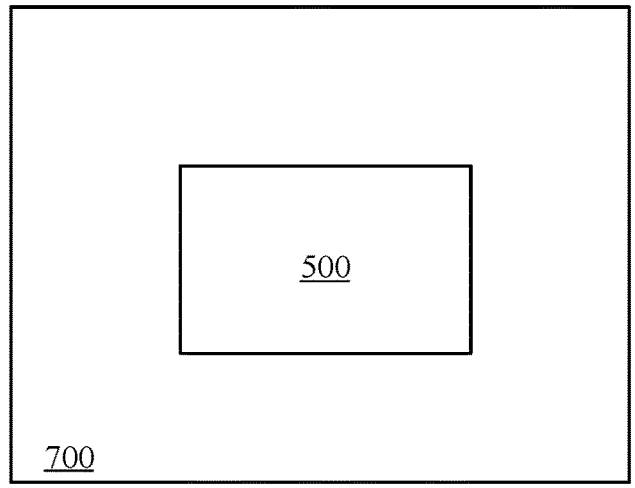
FIG. 7 is a schematic structural diagram of a display device according to an embodiment of the present disclosure.

FIG. 7 illustrates a schematic structural diagram of a display device 700 according to an embodiment of the present disclosure. The display device 700 may include the gate drive device 500 as shown in FIG. 5.

As previously mentioned, the shift register unit 100 and the drive method thereof, the gate drive circuit and the display device according to embodiments of the present disclosure may enable the output signal of the shift register unit 100 to be more stable by employing the latch circuit 113.

The display device provided by embodiments of the present disclosure may be, for example, an OLED display device, a liquid crystal display device or the like, and may be used in any product having a display function, such as an electronic paper display, a mobile phone, a tablet computer, a TV set, a notebook computer, a digital photo frame, or a navigation device and so on.

It is to be noted that the term "examples" used herein, particularly when followed by a listing of terms is merely exemplary and illustrative, and should not be deemed to be exclusive. Various aspects of the present disclosure may be implemented separately or in combination with one or more other aspects. Moreover, the description and specific embodiments in the present disclosure are intended to be merely for illustrative purposes and are not intended to limit the scope of the present disclosure.

The above are merely exemplary embodiments of the present disclosure but are not intended to limit the protection scope of the present disclosure, and the protection scope of the present disclosure is defined by the appended claims.

What is claimed is:

1. A shift register unit comprising:
    a shift resister circuit configured to delay a phase of an input signal from an input terminal, based on a first clock signal and a second clock signal, to output a first output signal from a first output terminal, wherein the first clock signal has an opposite phase with respect to the second clock signal; and
    an inverting circuit configured to generate an inverting signal having an inverted voltage with respect to a voltage of the first output signal and configured to output the inverting signal from a second output terminal;
    wherein the shift resister circuit comprises:
        a first input circuit configured to control a voltage of a first node based on the input signal;
        a second input circuit configured to control a voltage of a second node based on the first clock signal;
        a latch circuit coupled between the first node and the second node and configured to latch the voltage of the first node and the voltage of the second node, such that the voltage of the first node is inverted with respect to the voltage of the second node; and
        a first output circuit configured to selectively output one of the second clock signal and a first voltage from the first output terminal as the first output signal, based on the voltage of the first node and the voltage of the second node.

2. The shift register unit according to claim 1, wherein the inverting circuit comprises:
    a third input circuit configured to set a voltage of a third node as being inverted with respect to the voltage of the first output signal based on the first output signal and the first clock signal; and
    a second output circuit configured to selectively output one of the first voltage and a second voltage based on the first output signal and the voltage of the third node.

3. The shift register unit according to claim 2, wherein the third input circuit comprises a seventh transistor and an eighth transistor;
    wherein a control electrode of the seventh transistor is coupled to the first output terminal, a first electrode of the seventh transistor is coupled to the first voltage, and a second electrode of the seventh transistor is coupled to the third node; and
    wherein a control electrode of the eighth transistor is coupled to the first clock signal, a first electrode of the eighth transistor is coupled to the second voltage, and a second electrode of the eighth transistor is coupled to the third node.

4. The shift register unit according to claim 2, wherein the second output circuit comprises a ninth transistor, a tenth transistor, and a second capacitor;
    wherein a control electrode of the ninth transistor is coupled to the first output terminal, a first electrode of the ninth transistor is coupled to the first voltage, and a second electrode of the ninth transistor is coupled to the second output terminal;
    wherein a control electrode of the tenth transistor is coupled to the third node, a first electrode of the tenth transistor is coupled to the second voltage, and a second electrode of the tenth transistor is coupled to the second output terminal; and
    wherein a first terminal of the second capacitor is coupled to the third node, and a second terminal of the second capacitor is coupled to the second output terminal.

5. The shift register unit according to claim 1, wherein the first input circuit comprises a first transistor; and
    wherein a control electrode and a first electrode of the first transistor are coupled to the input terminal, and a second electrode of the first transistor is coupled to the first node.

6. The shift register unit according to claim 5, wherein the second input circuit comprises a second transistor; and
    wherein a control electrode of the second transistor is coupled to the first clock signal, a first electrode of the second transistor is coupled to the second voltage, and a second electrode of the second transistor is coupled to the second node.

7. The shift register unit according to claim 6, wherein the latch circuit comprises a third transistor and a fourth transistor;
    wherein a control electrode of the third transistor is coupled to the first node, a first electrode of the third transistor is coupled to the first voltage, and a second electrode of the third transistor is coupled to the second node; and
    wherein a control electrode of the fourth transistor is coupled to the second node, a first electrode of the fourth transistor is coupled to the first voltage, and a second electrode of the fourth transistor is coupled to the first node.

8. The shift register unit according to claim 7, wherein the first output circuit comprises a fifth transistor, a sixth transistor, and a first capacitor;
    wherein a control electrode of the fifth transistor is coupled to the first node, a first electrode of the fifth transistor is coupled to the second clock signal, a second electrode of the fifth transistor is coupled to the first output terminal, and the fifth transistor has a parasitic capacitance;

wherein a control electrode of the sixth transistor is coupled to the second node, a first electrode of the sixth transistor is coupled to the first voltage, and a second electrode of the sixth transistor is coupled to the first output terminal; and wherein a first terminal of the first capacitor is coupled to the first voltage, and a second terminal of the first capacitor is coupled to the second node.

9. The shift register unit according to claim 8, wherein the inverting circuit comprises:
   a third input circuit configured to set a voltage of a third node as being inverted with respect to the voltage of the first output signal based on the first output signal and the first clock signal; and
   a second output circuit configured to selectively output one of the first voltage and a second voltage based on the first output signal and the voltage of the third node.

10. The shift register unit according to claim 9, wherein the third input circuit comprises a seventh transistor and an eighth transistor;
   wherein a control electrode of the seventh transistor is coupled to the first output terminal, a first electrode of the seventh transistor is coupled to the first voltage, and a second electrode of the seventh transistor is coupled to the third node;
   wherein a control electrode of the eighth transistor is coupled to the first clock signal, a first electrode of the eighth transistor is coupled to the second voltage, and a second electrode of the eighth transistor is coupled to the third node;
   wherein the second output circuit comprises a ninth transistor, a tenth transistor, and a second capacitor;
   wherein a control electrode of the ninth transistor is coupled to the first output terminal, a first electrode of the ninth transistor is coupled to the first voltage, and a second electrode of the ninth transistor is coupled to the second output terminal;
   wherein a control electrode of the tenth transistor is coupled to the third node, a first electrode of the tenth transistor is coupled to the second voltage, and a second electrode of the tenth transistor is coupled to the second output terminal; and
   wherein a first terminal of the second capacitor is coupled to the third node, and a second terminal of the second capacitor is coupled to the second output terminal.

11. The shift register unit according to claim 1, wherein the second input circuit comprises a second transistor; and
   wherein a control electrode of the second transistor is coupled to the first clock signal, a first electrode of the second transistor is coupled to the second voltage, and a second electrode of the second transistor is coupled to the second node.

12. The shift register unit according to claim 1, wherein the latch circuit comprises a third transistor and a fourth transistor;
   wherein a control electrode of the third transistor is coupled to the first node, a first electrode of the third transistor is coupled to the first voltage, and a second electrode of the third transistor is coupled to the second node; and
   wherein a control electrode of the fourth transistor is coupled to the second node, a first electrode of the fourth transistor is coupled to the first voltage, and a second electrode of the fourth transistor is coupled to the first node.

13. The shift register unit according to claim 1, wherein the first output circuit comprises a fifth transistor, a sixth transistor, and a first capacitor;
   wherein a control electrode of the fifth transistor is coupled to the first node, a first electrode of the fifth transistor is coupled to the second clock signal, a second electrode of the fifth transistor is coupled to the first output terminal, and the fifth transistor has a parasitic capacitance;
   wherein a control electrode of the sixth transistor is coupled to the second node, a first electrode of the sixth transistor is coupled to the first voltage, and a second electrode of the sixth transistor is coupled to the first output terminal; and
   wherein a first terminal of the first capacitor is coupled to the first voltage, and a second terminal of the first capacitor is coupled to the second node.

14. A gate drive circuit comprising a plurality of cascaded shift register units according to claim 1, wherein an input terminal of each of the shift register units at stages other than the first stage is coupled to a first output terminal of a previous-stage shift register unit, and wherein a first clock signal of each of the shift register units at stages other than the first stage has opposite phase with respect to a first clock signal of the previous-stage shift register unit.

15. A display device comprising the gate drive circuit according to claim 14.

16. A drive method for driving the shift register unit according to claim 1, the drive method comprising:
   in the first phase, applying the input signal and the first clock signal at the second voltage and the second clock signal at the first voltage, such that the first node has the second voltage and the second node has the first voltage, the second clock signal at the first voltage is outputted from the first output terminal, and a signal at the second voltage is outputted from the second output terminal;
   in the second phase, applying the input signal and the first clock signal at the first voltage and the second clock signal at the second voltage, such that the first node keeps having the second voltage and the second node keeps having the first voltage, the second clock signal at the second voltage is outputted from the first output terminal, and a signal at the first voltage is outputted from the second output terminal; and
   in the third phase, applying the input signal and the second clock signal at the first voltage and the first clock signal at the second voltage, such that the second node has the second voltage and the first node has the first voltage, a signal at the first voltage is outputted from the first output terminal, and a signal at the second voltage is outputted from the second output terminal.

17. The drive method according to claim 16, wherein the first input circuit comprises a first transistor, the second input circuit comprises a second transistor, and the latch circuit comprises a third transistor and a fourth transistor, and wherein:
   in the first phase, the input signal at the second voltage enables the first transistor, such that the first node has the second voltage, the first clock signal at the second voltage enables the second transistor, and the first node with the second voltage enables the third transistor and disables the fourth transistor, such that the second node has the first voltage;
   in the second phase, the input signal at the first voltage disables the first transistor, the first clock signal at the first voltage disables the second transistor, and the first output circuit keeps the first node having the second voltage and keeps the second node having the first voltage, such that the third transistor keeps on and the fourth transistor keeps off; and in the third phase, the first clock signal at the second voltage enables the second transistor, such that the second node has the second voltage, the input signal at the first voltage disables the first transistor, and the second node with the second voltage enables the fourth transistor and disables the third transistor, such that the first node has the first voltage.

18. The drive method according to claim 16, wherein the first output circuit comprises a fifth transistor, a sixth transistor, and a first capacitor, and wherein:

in the first phase, the second node with the first voltage disables the sixth transistor, and the first node with the second voltage enables the fifth transistor, such that the second clock signal at the first voltage is outputted from the first output terminal;

in the second phase, the parasitic capacitance of the fifth transistor keeps the first node having the second voltage, the latch circuit keeps the second node having the first voltage, the first node with the second voltage keeps the fifth transistor on, and the second node with the first voltage keeps the sixth transistor off, such that the second clock signal at the second voltage is outputted from the first output terminal; and in the third phase, the first node with the first voltage disables the fifth transistor, and the second node with the second voltage enables the sixth transistor, such that a signal at the first voltage is outputted from the first output terminal.

19. The drive method according to claim 16, wherein the third input circuit comprises a seventh transistor and an eighth transistor, and wherein:

in the first phase, the first output terminal with the first voltage disables the seventh transistor, and the first clock signal at the second voltage enables the eighth transistor, such that the third node has the second voltage;

in the second phase, the first clock signal at the first voltage disables the eighth transistor, and the first output terminal with the second voltage enables the seventh transistor, such that the third node has the first voltage; and in the third phase, the first output terminal with the first voltage disables the seventh transistor, and the first clock signal at the second voltage enables the eighth transistor, such that the third node has the second voltage.

20. The drive method according to claim 16, wherein the second output circuit comprises a ninth transistor, a tenth transistor, and a second capacitor, and wherein:

in the first phase, the first output terminal with the first voltage disables the ninth transistor, and the third node with the second voltage enables the tenth transistor, such that a signal at the second voltage is outputted from the second output terminal;

in the second phase, the third node with the first voltage disables the tenth transistor, and the first output terminal with the second voltage enables the ninth transistor, such that a signal at the first voltage is outputted from the second output terminal; and in the third phase, the first output terminal with the first voltage disables the ninth transistor, and the third node with the second voltage enables the tenth transistor, such that a signal at the second voltage is outputted from the second output terminal.

* * * * *